(12) United States Patent
Aronson et al.

(10) Patent No.: US 7,286,372 B2
(45) Date of Patent: Oct. 23, 2007

(54) TRANSCEIVER MODULE WITH PCB HAVING EMBEDDED TRACES FOR EMI CONTROL

(75) Inventors: Lewis B. Aronson, Los Altos, CA (US); Donald A. Ice, Milpitas, CA (US)

(73) Assignee: Finisar Corporation, Sunnyvale, CA (US)

( * ) Notice: Subject to any disclaimer, the term of this patent is extended or adjusted under 35 U.S.C. 154(b) by 255 days.

(21) Appl. No.: 10/831,600

(22) Filed: Apr. 23, 2004

(65) Prior Publication Data

US 2004/0196642 A1 Oct. 7, 2004

Related U.S. Application Data

(62) Division of application No. 10/425,090, filed on Apr. 28, 2003, now Pat. No. 6,999,323.

(60) Provisional application No. 60/419,444, filed on Oct. 17, 2002.

(51) Int. Cl.
*H05K 9/00* (2006.01)

(52) U.S. Cl. .............. 361/818; 361/801; 361/753; 361/778; 361/794; 361/748; 174/50.52; 174/260; 174/261; 174/262; 439/59; 439/60; 439/62

(58) Field of Classification Search ............... 439/59, 439/60, 62; 174/50.52; 361/801
See application file for complete search history.

(56) References Cited

U.S. PATENT DOCUMENTS

| 4,992,850 | A | * | 2/1991 | Corbett et al. ............ 257/203 |
| 5,335,147 | A | * | 8/1994 | Weber .................... 361/818 |
| 5,495,358 | A | * | 2/1996 | Bartig et al. ............ 398/202 |
| 5,505,628 | A | * | 4/1996 | Ramey et al. ........... 439/76.1 |
| 5,777,856 | A |   | 7/1998 | Phillips et al. ........... 361/816 |
| 5,838,549 | A | * | 11/1998 | Nagata et al. ........... 361/794 |
| 5,986,892 | A | * | 11/1999 | Hargy, III ............... 361/759 |
| 6,181,004 | B1 | * | 1/2001 | Koontz et al. ........... 257/691 |
| 6,400,573 | B1 | * | 6/2002 | Mowatt et al. .......... 361/719 |
| 6,431,764 | B1 |   | 8/2002 | Scharf et al. ............. 385/88 |
| 6,452,114 | B1 | * | 9/2002 | Schweitzer et al. ...... 174/261 |
| 6,497,588 | B1 |   | 12/2002 | Scharf et al. ............ 439/607 |
| 6,512,181 | B2 | * | 1/2003 | Okubo et al. ............ 174/255 |
| 6,521,843 | B1 | * | 2/2003 | Kohya .................... 174/255 |
| 6,559,484 | B1 | * | 5/2003 | Li et al. .................. 257/207 |
| 6,721,185 | B2 | * | 4/2004 | Dong et al. .............. 361/736 |
| 2002/0131122 | A1 |   | 9/2002 | Anderl et al. ............ 359/152 |
| 2003/0117787 | A1 | * | 6/2003 | Nakauchi ................ 361/818 |

* cited by examiner

*Primary Examiner*—Dean A. Reichard
*Assistant Examiner*—Hoa C Nguyen
(74) *Attorney, Agent, or Firm*—Workman Nydegger

(57) ABSTRACT

A PCB is provided that is suitable for use in applications where EMI control is of interest. The PCB includes circuitry that communicates with an edge connector having edge traces located on its surface. Additionally, embedded traces are disposed within the dielectric material of the PCB, and each embedded trace electrically connects an edge trace with a corresponding median trace located on a surface of the PCB. An embedded ground layer substantially disposed within the dielectric material defines an area within the dielectric material through which the embedded traces pass. Finally, one or more vias are provided that extend through the dielectric material of the PCB and are filled with a conductive material. The vias are electrically connected to the embedded ground layer and configured to electrically communicate with an associated module. In this way, a structure is implemented that facilitates control of electromagnetic radiation emitted by the PCB circuitry.

26 Claims, 10 Drawing Sheets

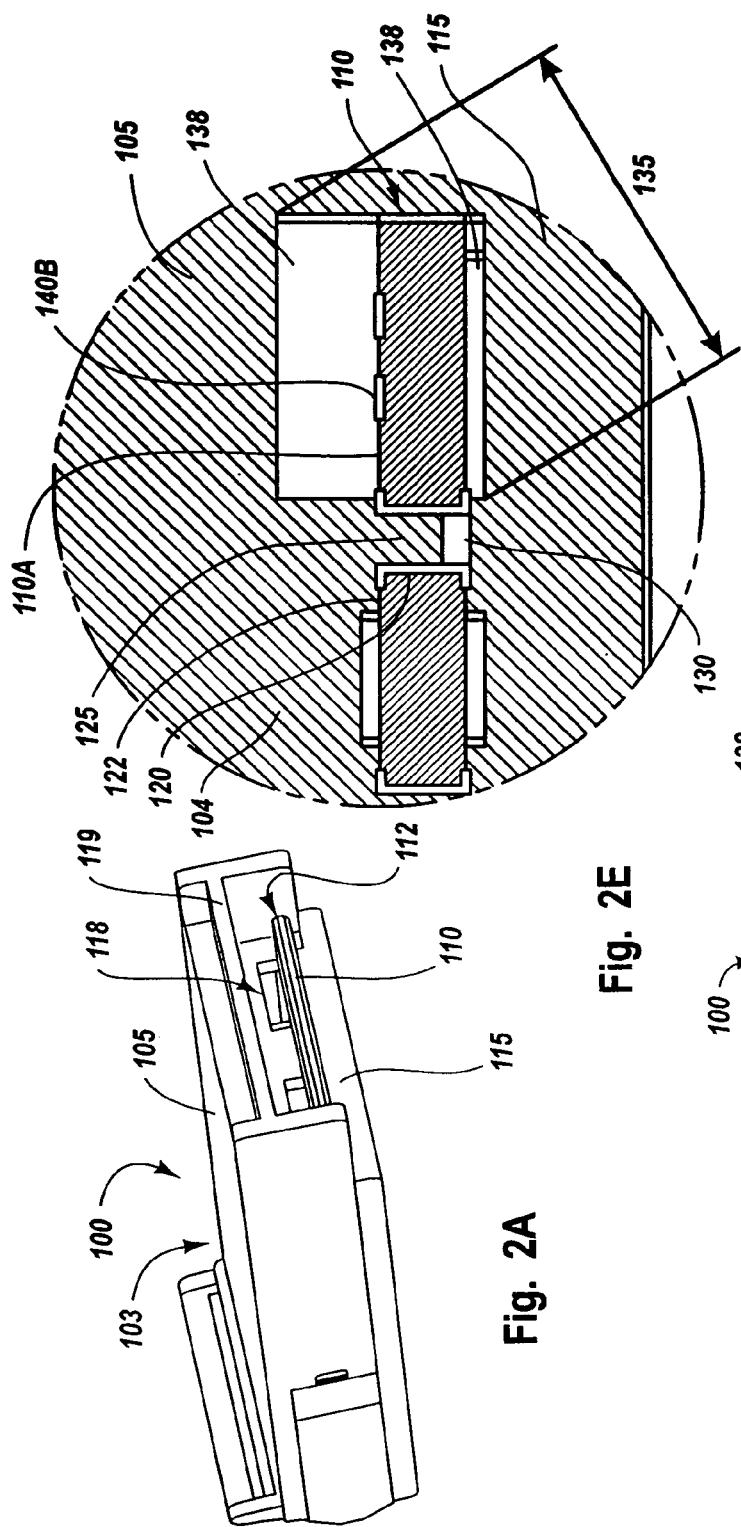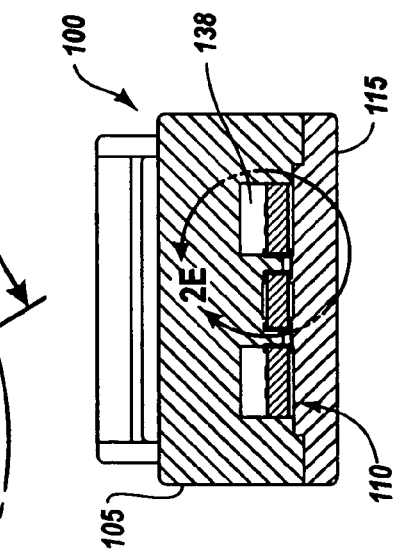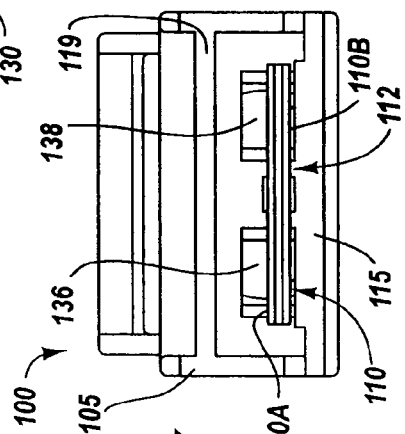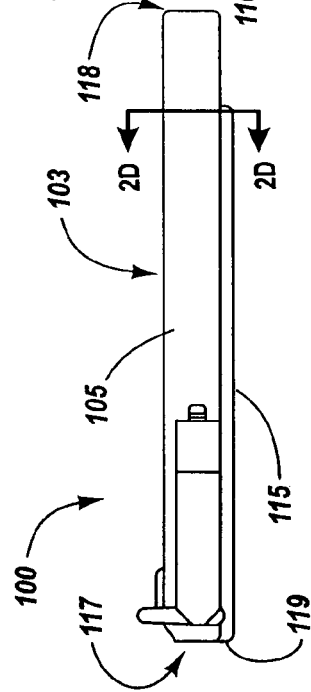

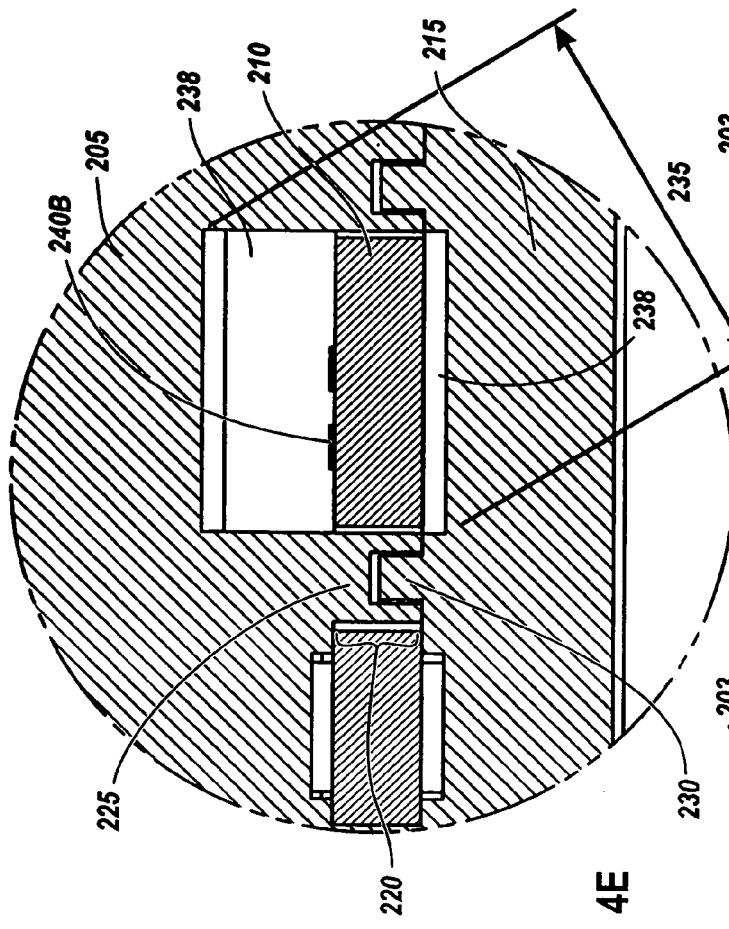
Fig. 4E
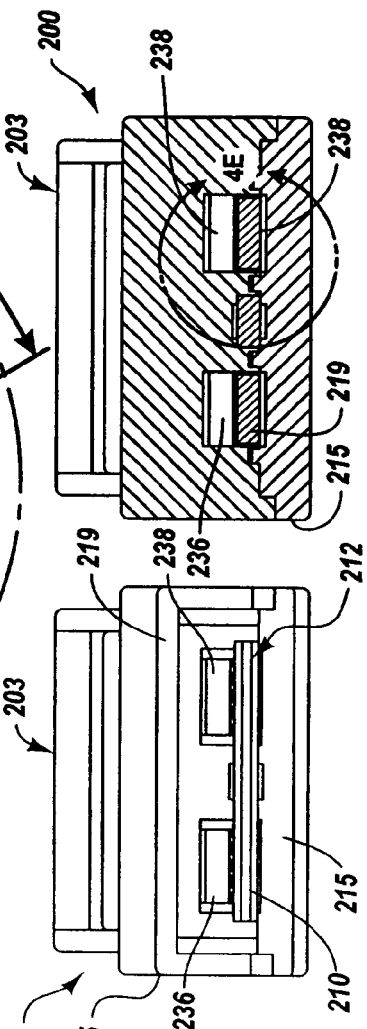
Fig. 4D
Fig. 4B
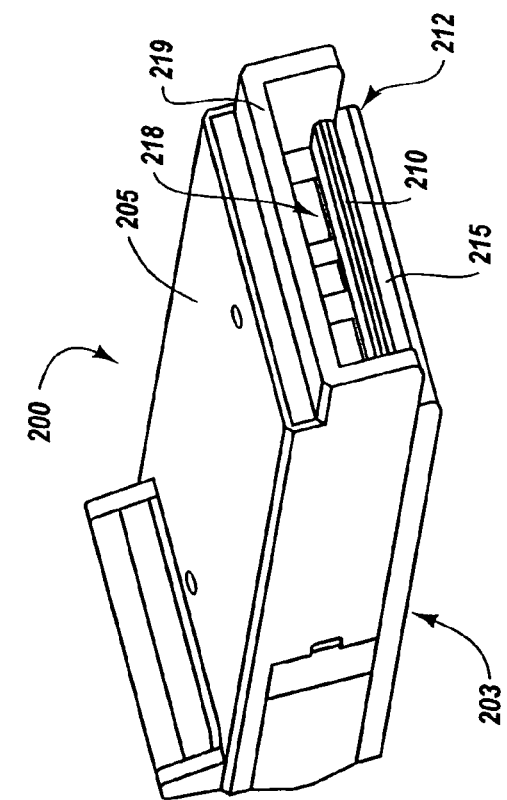
Fig. 4A
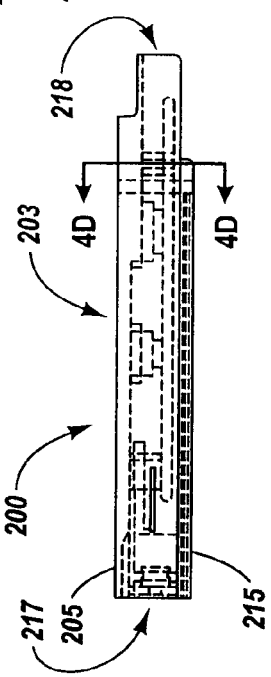
Fig. 4C

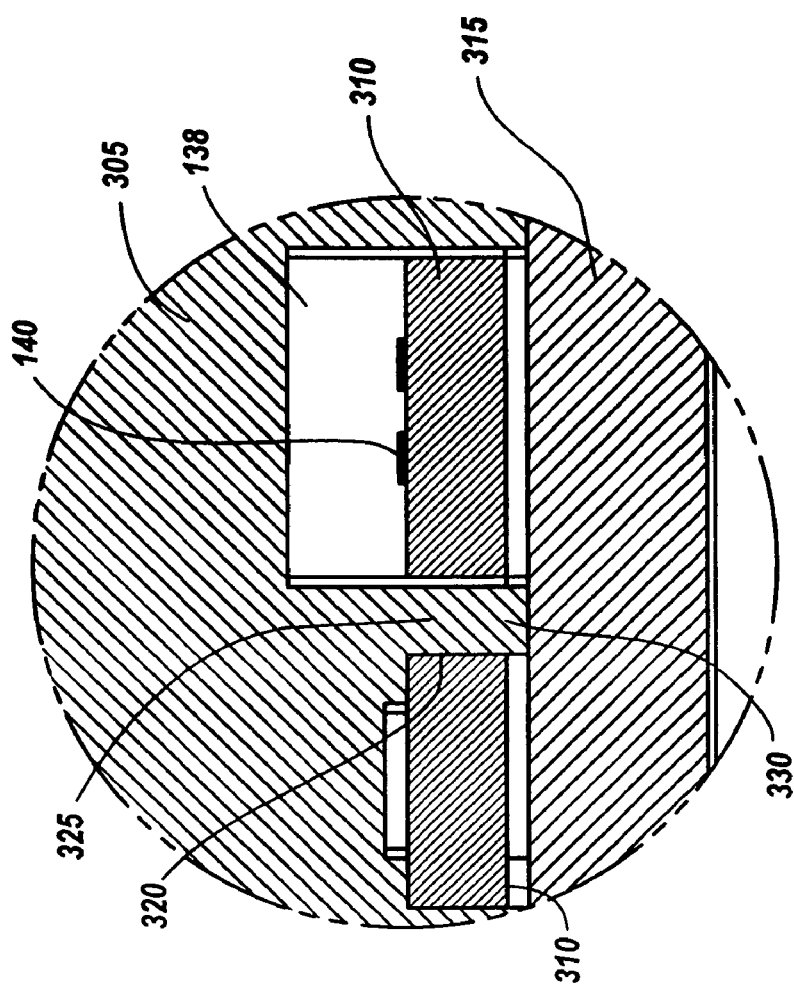
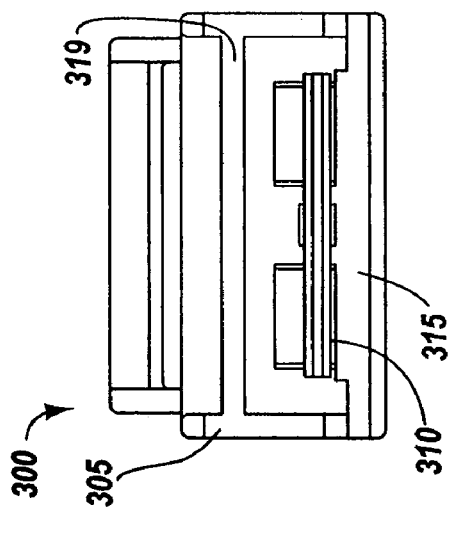
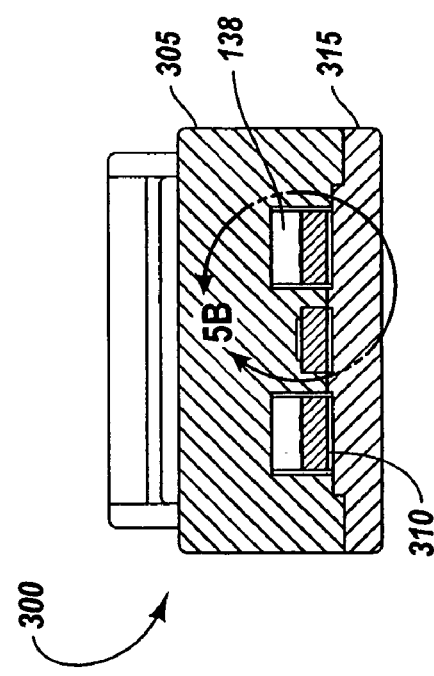

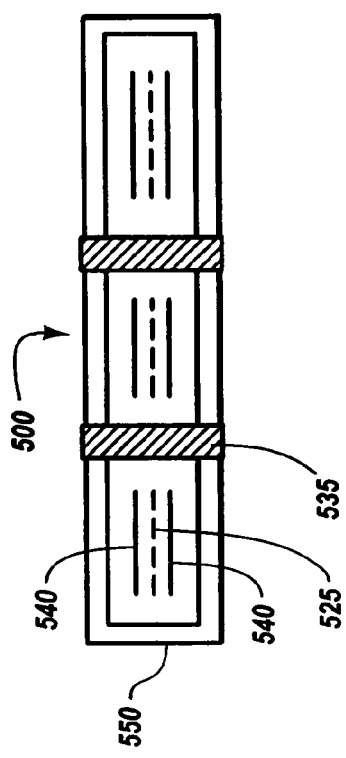
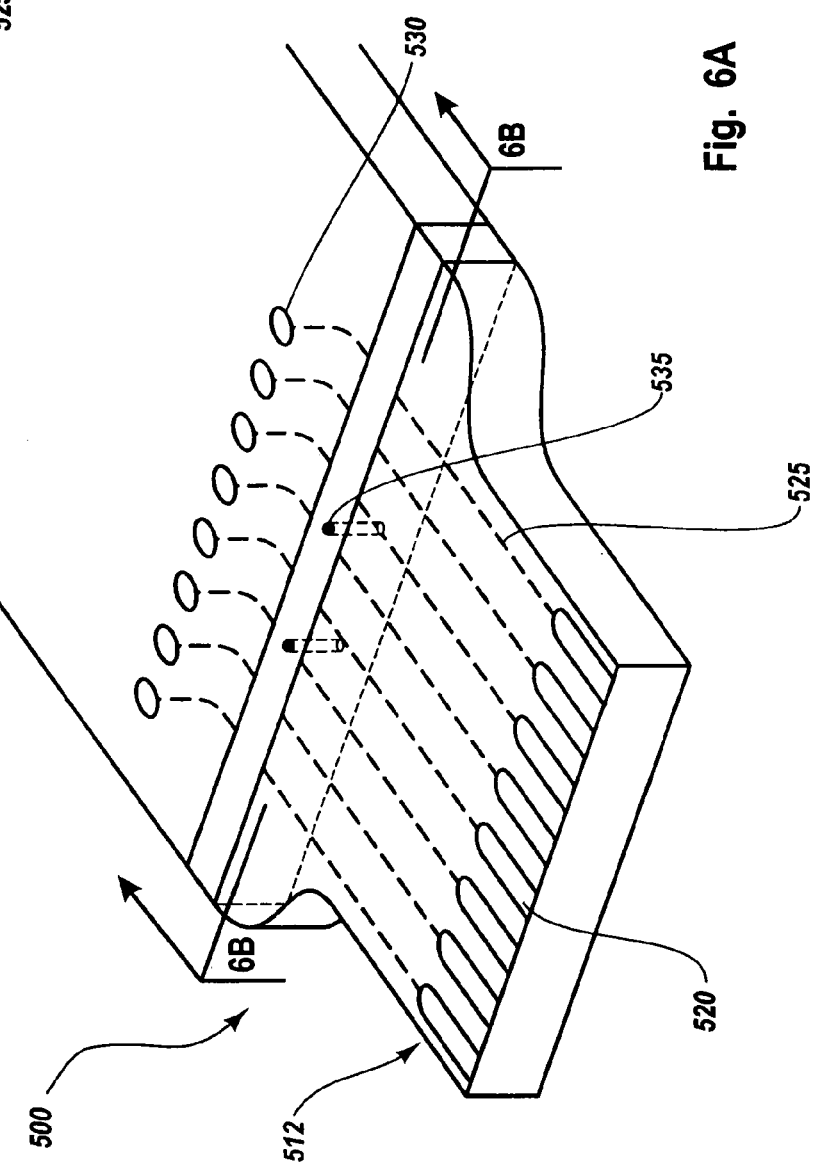
Fig. 6B
Fig. 6A

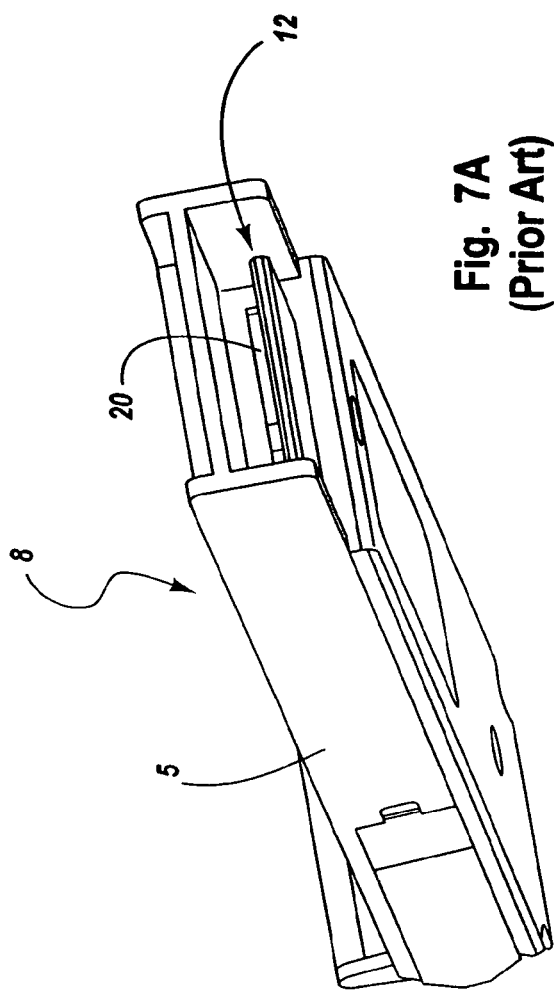
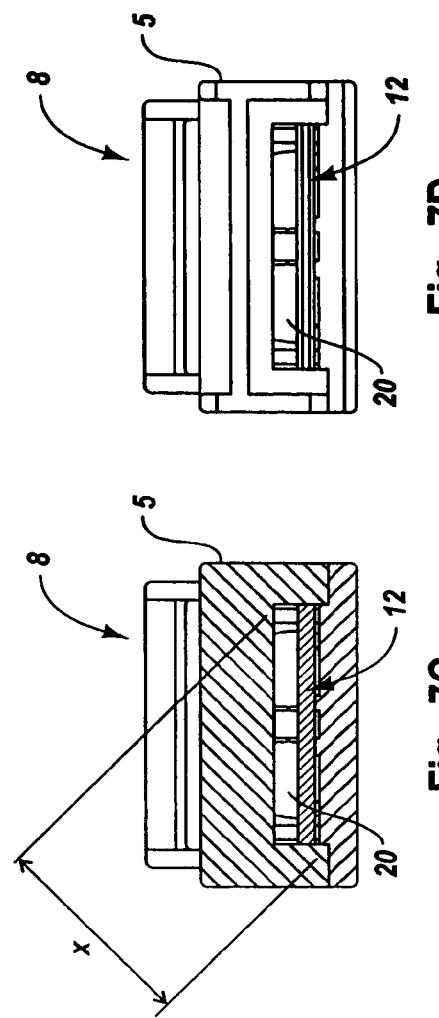
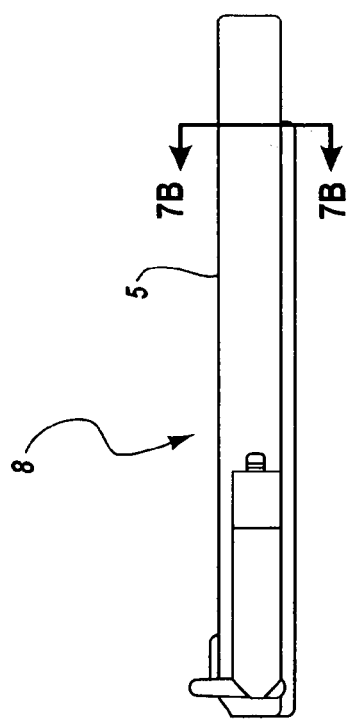
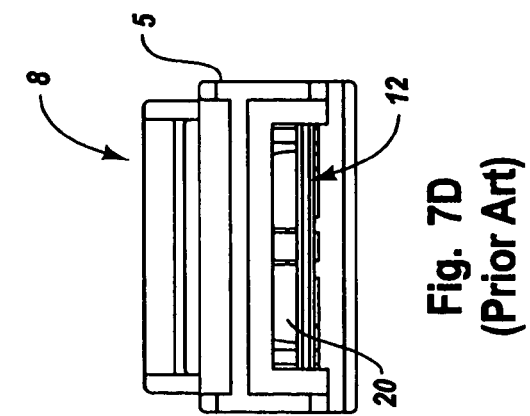
Fig. 7A (Prior Art)
Fig. 7B (Prior Art)
Fig. 7C (Prior Art)
Fig. 7D (Prior Art)

TRANSCEIVER MODULE WITH PCB HAVING EMBEDDED TRACES FOR EMI CONTROL

CROSS-REFERENCE TO RELATED APPLICATIONS

This application is a division, and claims the benefit, of U.S. patent application Ser. No. 10/425,090, entitled ELECTROMAGNETIC INTERFERENCE CONTAINMENT TRANSCEIVER MODULE, filed Apr. 28, 2003, now U.S. Pat. No. 6,999,323 which, in turn, claims the benefit of U.S. Provisional Patent Application No. 60/419,444, filed Oct. 17, 2002. Both of the aforementioned applications are incorporated herein in their respective entireties by this reference.

BACKGROUND OF THE INVENTION

1. Field of the Invention

The present invention generally relates to optical modules. More particularly, exemplary embodiments of the invention concern an optical module that includes

2. Related Technology

Fiber optics are increasingly used for transmitting voice and data signals. As a transmission medium, light provides a number of advantages over traditional electrical communication techniques. For example, light signals allow for extremely high transmission rates and very high bandwidth capabilities. Also, light signals are resistant to electromagnetic interferences that would otherwise interfere with electrical signals. Light also provides a more secure signal because it doesn't allow portions of the signal to escape from the fiber optic cable as can occur with electrical signals in wire-based systems. Light also can be conducted over greater distances without the signal loss typically associated with electrical signals on copper wire.

While optical communications provide a number of advantages, the use of light as a transmission medium presents a number of implementation challenges. In particular, the data carried by a light signal must be converted to an electrical format when received by a device, such as a network switch. Conversely, when data is transmitted to the optical network, it must be converted from an electronic signal to a light signal. A number of protocols define the conversion of electrical signals to optical signals and transmission of those optical, including the ANSI Fibre Channel (FC) protocol. The FC protocol is typically implemented using a transceiver module at both ends of a fiber optic cable. Each transceiver module typically contains a laser transmitter circuit capable of converting electrical signals to optical signals, and an optical receiver capable of converting received optical signals back into electrical signals.

Typically, a transceiver module is electrically interfaced with a host device—such as a host computer, switching hub, network router, switch box, computer I/O and the like—via a compatible connection port. Moreover, in some applications it is desirable to miniaturize the physical size of the transceiver module to increase the port density, and therefore accommodate a higher number of network connections within a given physical space. In addition, in many applications, it is desirable for the module to be hot-pluggable, which permits the module to be inserted and removed from the host system without removing electrical power. To accomplish many of these objectives, international and industry standards have been adopted that define the physical size and shape of optical transceiver modules to insure compatibility between different manufacturers. For example, in 2000, a group of optical manufacturers developed a set of standards for optical transceiver modules called the Small Form-factor Pluggable ("SFP") Transceiver Multi-Source Agreement ("MSA"), incorporated herein by reference. In addition to the details of the electrical interface, this standard defines the physical size and shape for the SFP transceiver modules, and the corresponding host port, so as to insure interoperability between different manufacturers' products. There have been several subsequent standards, and proposals for new standards, including the XFP MSA for 10 Gigabit per second modules using a serial electrical interface, that also define the form factors and connection standards for pluggable optoelectronic modules, such as the published draft version 0.92 (XFP MSA), incorporated herein by reference.

As optical transmission speed provided by electronic modules increases, additional problems arise. For example, electronic devices and components operating at high frequencies typically emit signals referred to as electromagnetic interference. This electromagnetic interference, referred to as "EMI", is electrical noise in the form of an electromagnetic wave. The phenomenon is undesirable because EMI can interfere with the proper operation of other electrical components. Optical transceiver packages, especially those operating at high transmission speeds, are especially susceptible to emitting EMI. In particular, the physical configuration of existing transceiver modules does a poor job of containing EMI—especially as the generating speed of the module increases. For example, as is shown in FIGS. 7A through 8C, a transceiver module 8 typically includes a housing 5 that contains a printed circuit board 10 and associated electrical and optical components. However, the housing 5 does not completely enclose the printed circuit board 10. Instead, a portion of the printed circuit board 10 is formed as an edge connector 12. The edge connector 12 includes a number of high speed traces for communicating signals to and from the electrical contacts on the edge connector 12. In operation, the edge connector 12 is capable of electrically and physically interfacing with a corresponding host connector 702 that is positioned on a host board 700.

Thus, in order for the edge connector 12 to be exposed externally to the module, the module housing 5 must provide an opening, shown at 20 in FIG. 6B. Moreover, insofar as the housing 5 is typically constructed of a conductive material, the opening 20 typically provides a minimum clearance area (the diagonal dimension of which is represented as "X" in FIG. 6B), so as to not electrically interfere with the high speed traces on the edge connector portion of the board 10. Unfortunately, this opening 20 also allows for the emission of an unacceptable amount if EMI; the emission is especially problematic as transmission speeds increase.

Therefore, there is a need in the industry for a pluggable module, such as an optoelectronic transceiver module, that is configured so as to minimize the emission of EMI. Preferably, the module configuration could be used in environments having high frequency data signal transmissions. Moreover, the module configuration should not affect the data signal integrity or the speed capabilities of the module. In addition, the electronic module should be implemented in a manner that meets existing standard form factors. Preferably, the module should maintain the ability to properly dissipate heat from the components inside the module.

BRIEF SUMMARY OF AN EXEMPLARY EMBODIMENT OF THE INVENTION

Briefly summarized, exemplary embodiments of the present invention are directed to a PCB suitable for use in connection with electronic modules, such as optical transceiver modules for example. An exemplary PCB includes a variety of electronic components disposed on its surface, as well as a connector portion formed at one end. The connector portion includes a plurality of conductive edge traces that interconnect with traces of a host system, such as a computer, signal router, or other input/output device, when an electronic module wherein the PCB is disposed is interfaced with the host system.

The PCB also includes embedded traces disposed within the dielectric material of the PCB and electrically connecting an edge trace with a corresponding median trace located on a surface of the PCB. An embedded ground layer substantially disposed within the dielectric material defines an area within the dielectric material through which the embedded traces pass. Finally, one or more vias are provided that extend through the dielectric material of the PCB and are filled with a conductive material. The vias are electrically connected to the embedded ground layer and configured to electrically communicate with an associated electronic module.

In this way, a structure is implemented that facilitates control of electromagnetic radiation emitted by the PCB circuitry. These, and other, aspects of the present invention will become more fully apparent from the following description and appended claims.

BRIEF DESCRIPTION OF THE DRAWINGS

In order that the manner in which the above recited and other advantages and features of the invention are obtained, a more particular description of the invention briefly described above will be given by making reference to a specific embodiment that is illustrated in the appended drawings. These drawings depict only a few embodiments of the invention and are not to be considered limiting of its scope:

FIG. 2A is another perspective view of a transceiver module configured to contain EMI waves in accordance with one embodiment of the present invention;

FIG. 2B is a rear view of the transceiver module of FIG. 2A;

FIG. 2C is a side view of the transceiver module of FIG. 2A;

FIG. 2D illustrates a cutaway rear view taken along lines 2D-2D of FIG. 2C;

FIG. 2E illustrates a close up cutaway rear view taken along lines 2E in FIG. 2D;

FIG. 4A is another perspective view of the transceiver module of FIG. 3A;

FIG. 4B is a rear view of the transceiver module of FIG. 4A;

FIG. 4C is a side view of the transceiver module of FIG. 4A;

FIG. 4D is a cutaway rear view of the transceiver module taken along lines 4D-4D in FIG. 4C;

FIG. 4E is a close up cutaway view of the transceiver module taken along lines 4E in FIG. 4D;

FIG. 5A is an end view of a transceiver module configured in accordance with another embodiment of the present invention;

FIGS. 5B-5C are a close-up cut away view of the transceiver module taken along lines 5B in FIG. 5A;

FIG. 6A illustrates a perspective view of a printed circuit board portion in accordance with yet another alternative embodiment of the present invention;

FIG. 6B illustrates a cutaway rear view of a printed circuit board taken along lines 6B in FIG. 6A; and FIGS. 7A-8C show various exemplary views of prior art modules.

DETAILED DESCRIPTION OF EXEMPLARY EMBODIMENTS

Reference will now be made to the drawings to describe exemplary embodiments of the invention. It is to be understood that the drawings are diagrammatic and schematic representations of such exemplary embodiments, and are not limiting of the present invention, nor are they necessarily drawn to scale.

In general, the present invention relates to an electronic pluggable module that is structured in a manner that minimizes the emission of potentially harmful EMI waves. In preferred embodiments, the module maintains a low profile, and conforms with the physical dimensions set forth by existing industry standards. In addition, EMI shielding is provided in a manner that does not interfere with the electronic performance of the module. Likewise, the module is constructed so as to dissipate heat efficiently and thereby avoid overheating of the electrical or optical components. Although the preferred embodiments are described in the context of an optoelectronic transceiver module, it will be appreciated that teachings of the present invention can be used in the context of other environments, including other electrical pluggable modules.

Figure 1B:
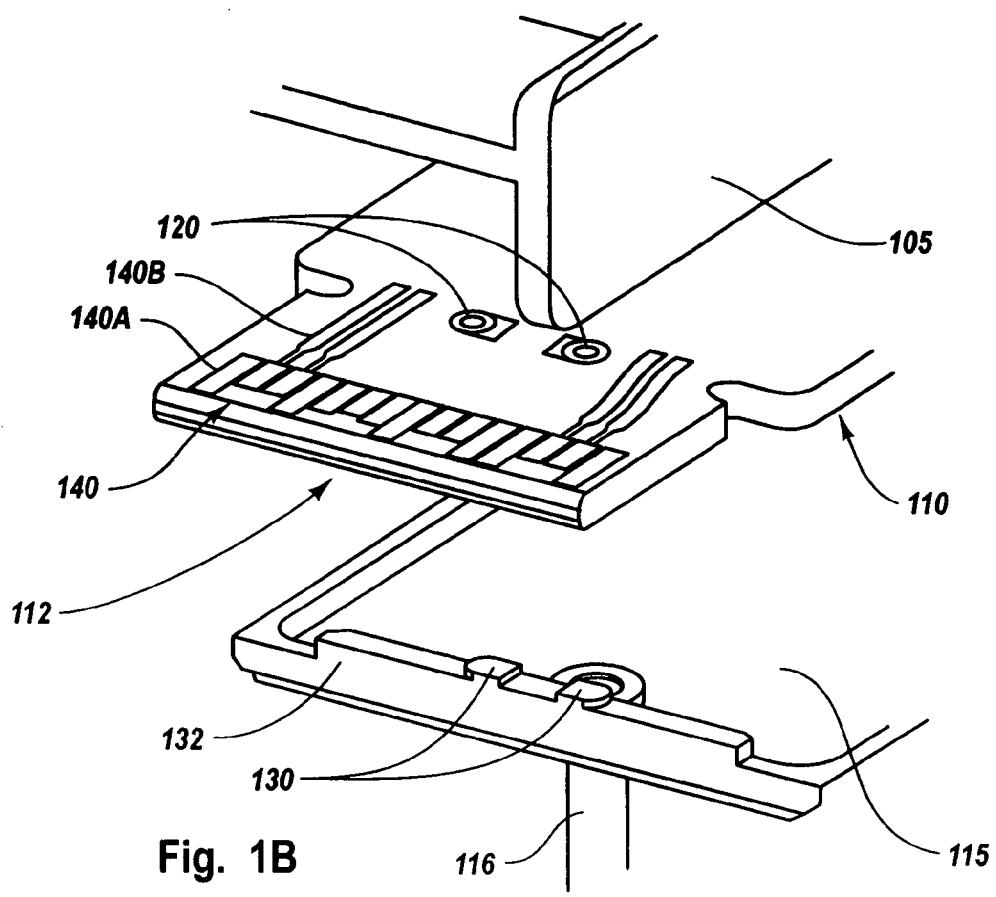
FIG. 1B is an exploded perspective view of the rear end of a transceiver module configured to contain EMI waves in accordance with one embodiment of the present invention.
Figure 1A:
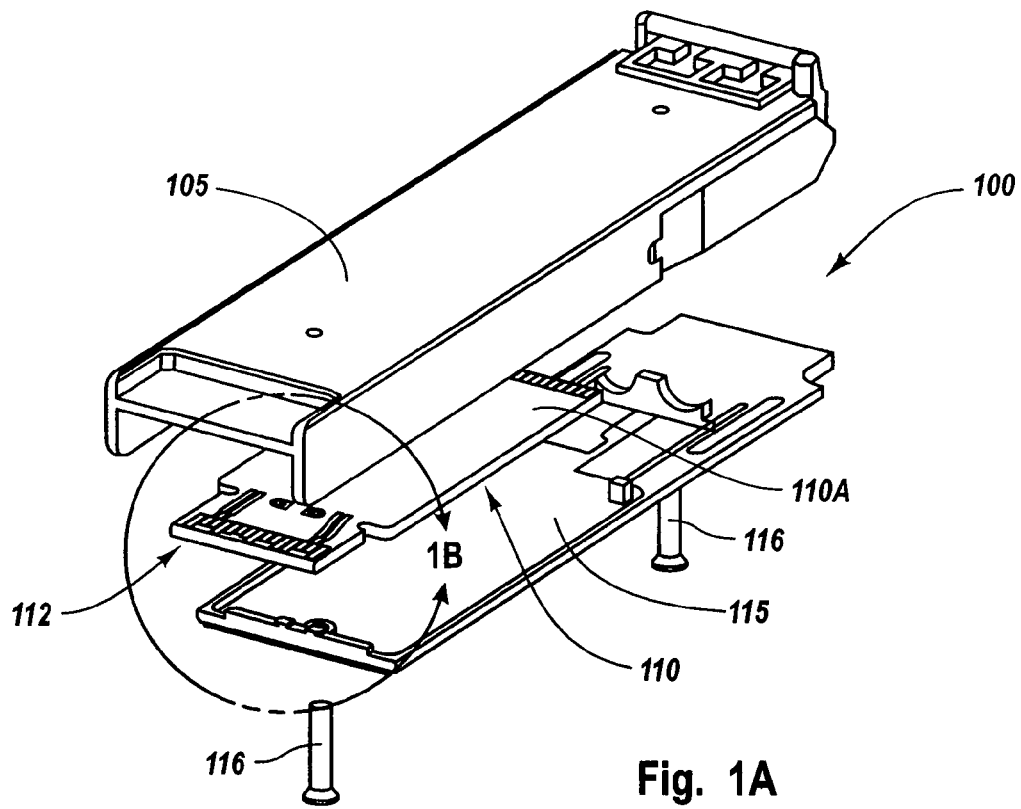
FIG. 1A is an exploded perspective view of a transceiver module configured to contain EMI waves in accordance with one embodiment of the present invention.
Figure 1D:
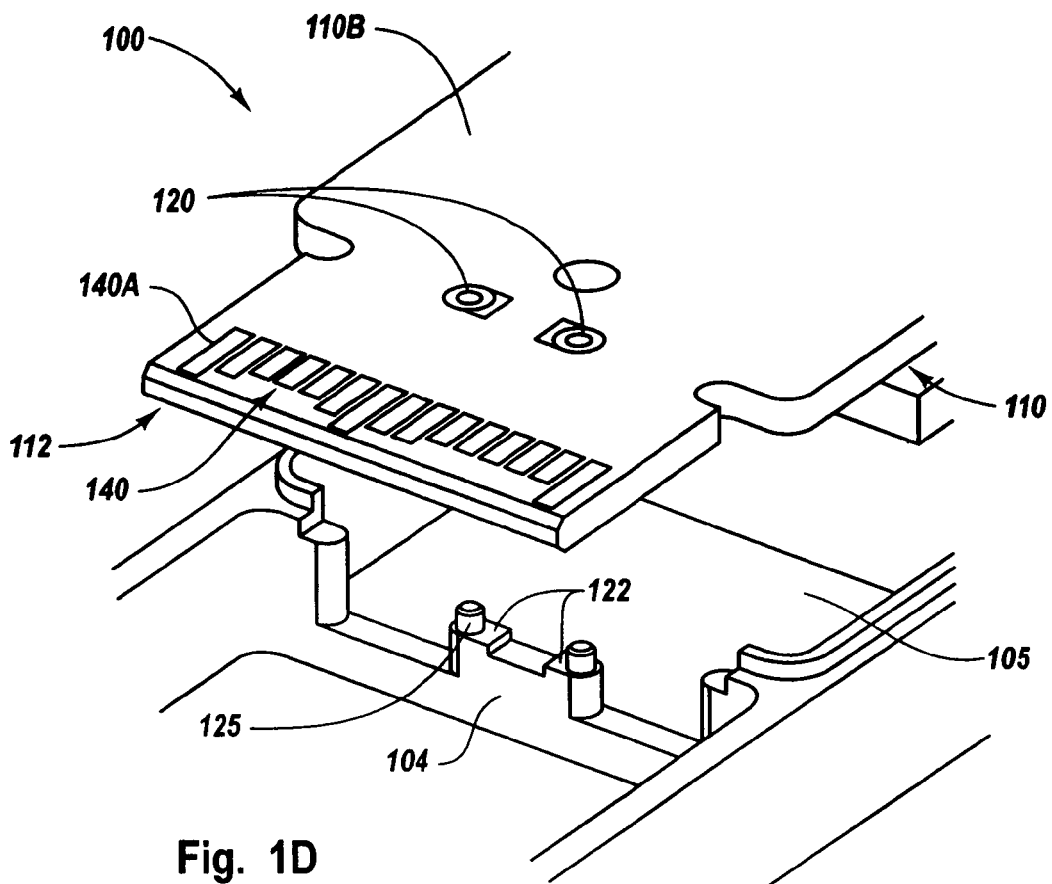
FIG. 1D is an exploded perspective view of the bottom side of the rear end of a transceiver module configured to contain EMI waves in accordance with one embodiment of the present invention.
Figure 1C:
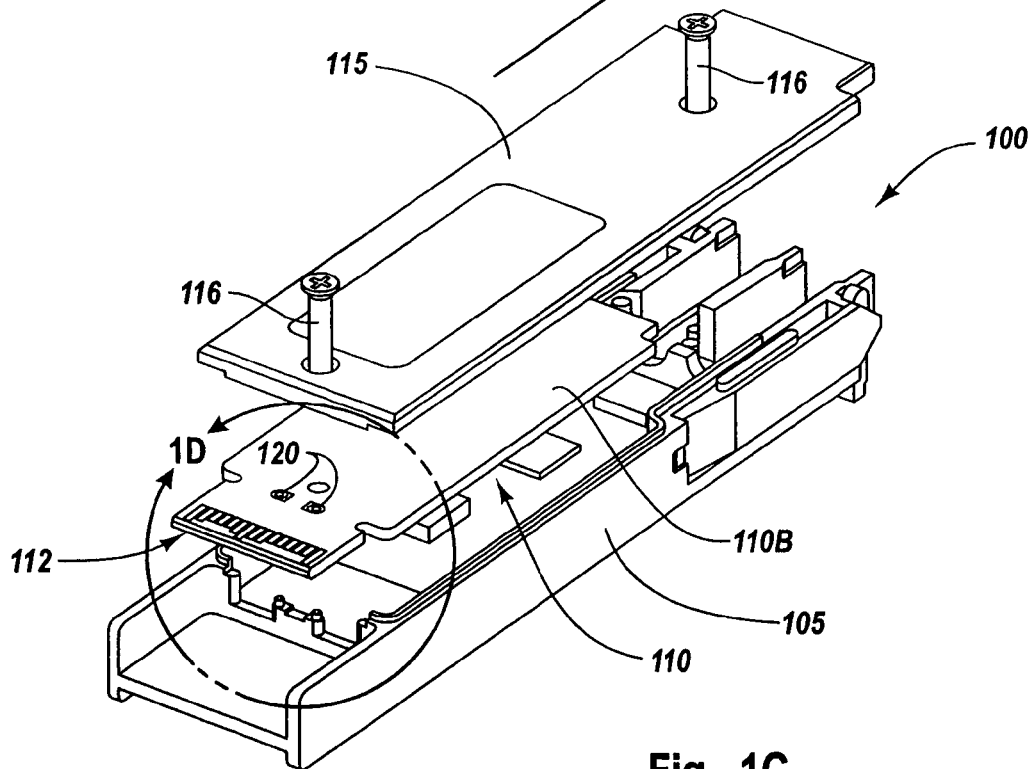
FIG. 1C is an exploded perspective view of the bottom side of a transceiver module configured to contain EMI waves in accordance with one embodiment of the present invention.
Figure 8A:
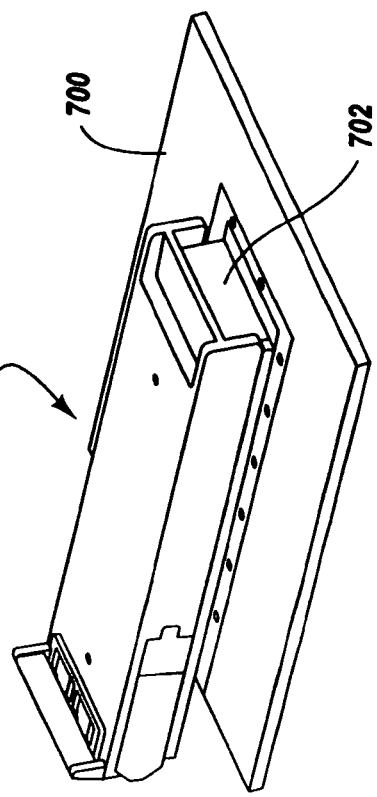
Figure 8B:
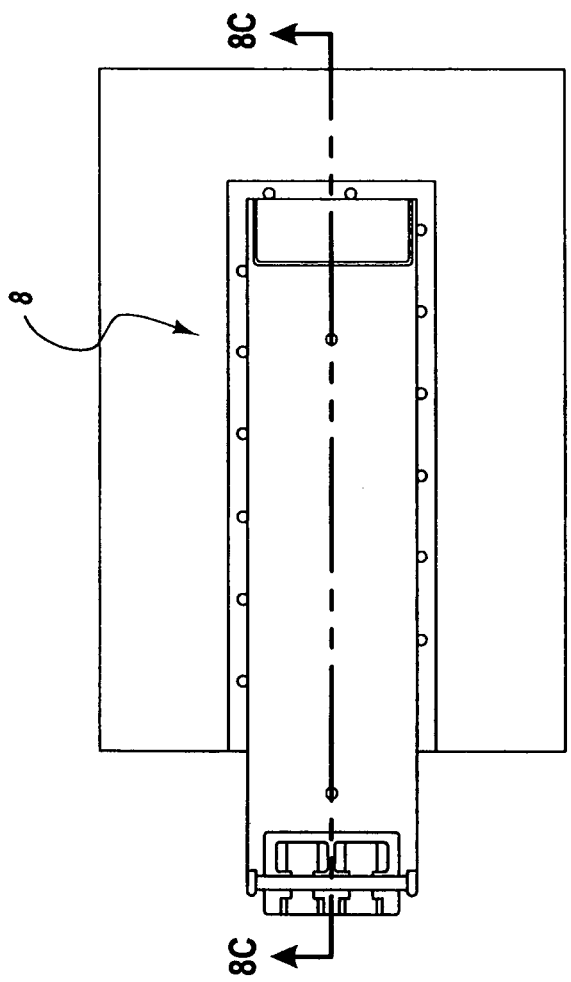
Figure 8C:
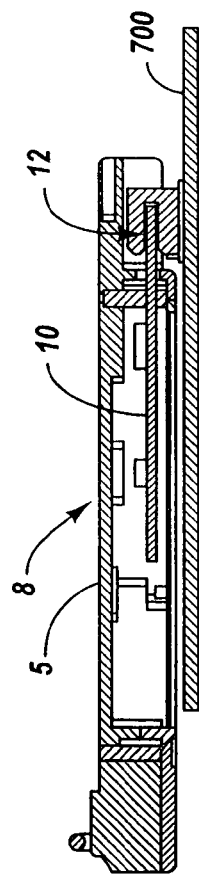

Reference is initially made to FIGS. 1A-1D and FIGS. 2A-2E, which together illustrate one presently preferred embodiment of a transceiver module, designated generally at 100. As shown in FIGS. 1A and 1C, the transceiver module 100 includes a top housing portion 105, a printed circuit board ("PCB") 110, and a bottom housing portion 115. The top and bottom housing portions 105, 115 are designed to fit together and form an interior portion containing a PCB 110 and associated electronic and optical components. A set of screws 116 (or any other appropriate fastening mechanism) are used to fasten the two housing portions 105, 115 together to form the outer shell, or outer housing 103, of the transceiver module 100. When joined together, the top and bottom housing portions 105, 115 also form a front opening 117 and a rear opening 118. The front opening 117 is designed to accept a modular plug (not shown) that is connected to two optical waveguides, one input waveguide and one output waveguide (not shown), the structure and implementation of which are well known in the art of optical communications. The rear opening 118 is designed to expose an electrical edge connector, denoted at 112, formed along one end of the PCB 110. The edge connector 112 is capable of being electrically and physically received within a corresponding connector (such as is shown in FIG. 8A at 702) that is typically mounted on a host board (700 in FIG. 8A) of an appropriate host device (not shown). The housing portions 105, 115 can include multiple holes or gaps that allow heat to escape from inside the transceiver module 100 during operation.

In a preferred embodiment, the top and bottom housing portions 105, 115 are at least partially composed of a conductive material so that when the housing portions are joined together, a shell of conductive material is formed about the periphery of the transceiver module 100. The conductive material on the housing portions 105, 115 form what is known as the chassis ground. A ground is an electrical pathway or drop through which voltage can pass. As discussed below, a ground can also have electromagnetic effects. The chassis ground is electrically isolated from all circuitry on the PCB 110.

As noted, the PCB 110 is substantially positioned within the interior portion formed between the top and bottom housing portions 105, 115. The top and bottom housing portions 105, 115 contain various support structures to securely support the PCB 110 when the two housing portions are joined together. FIGS. 2A-2C illustrate a completed transceiver module 100 in which the PCB 110 is securely positioned between the top and bottom housing portions 105, 115. The PCB 110 includes a top surface 110A oriented toward the top housing portion 105, and a bottom surface 110B oriented toward the bottom housing portion 115.

The PCB 100 further includes a plurality of high speed traces 140 that electrically transfer data from one location to another. Specifically, the PCB 100 includes edge traces 140A that are located on both the top and bottom surfaces 110A and 110B of the edge connector 112, and connecting traces 140B located on the surface of the top PCB surface. Because data are being transmitted at a very high frequency in an electrical form, potentially harmful EMI waves are generated within the transceiver module 100. The type of EMI waves that are allowed to leak out of the transceiver module 100 is dependent on the size and position of any opening present in the housing. Moreover, if the housing portions 105, 115 were not grounded, EMI would not be efficiently contained.

The largest opening present in the housing of a typical prior art transceiver module is located at the rear end of the housing, designated at 119, where the edge connector of the PCB 110 is exposed so as to electrically connect with a corresponding connector. As noted, the rear opening 118 located at the rear housing end 119 must provide a minimum clearance for the PCB 110 so as to not interfere with the electrical signals present on the high speed traces 140A and 140B communicating with the edge connector 112. In known devices, the largest opening distance is generally measured diagonally across an opening (denoted as the dimension "X" in FIG. 7C) because this is the longest one dimensional length of space available. The length of the largest opening is mathematically related to the frequencies of EMI waves that are allowed to leak out of the transceiver module. As data are transferred faster, the operating frequencies of the electrical components increase; thus the frequency of emitted EMI increases. Because frequency is inversely proportional to wavelength, the higher the frequency, the shorter the relative wavelength of the EMI waves that are generated by the high speed data. Therefore, in order to reduce the leakage of EMI waves generated from higher frequency data transmissions, the largest opening distance must be decreased. Unfortunately, the opening at the rear of the transceiver module cannot be entirely eliminated because of the high speed traces that are located on the surface of the PCB. As mentioned, there must be some space between the housing portions, which are grounded at chassis ground, and the conductive traces that pass through rear opening of the transceiver module in order to avoid signal degradation of the signals passing through the traces.

Continuing reference is made to FIGS. 1A-2E. Embodiments of the present invention provide a means for reducing the size of the opening, thereby minimizing the amount of EMI that can escape therethrough. For example, in the illustrated embodiment, the PCB 110 includes at least two holes that extend through the entire thickness of the board designated at 110. The holes are lined with a conductive material to form electrically conductive vias 120. FIG. 2E illustrates how the holes are lined to create the vias 120. The vias 120 are formed in the board 110 in a manner as to be electrically isolated from the remainder of the circuitry on the PCB 110. As will be seen, the conductive vias 120 enable a "chassis ground fence" to be created adjacent the rear housing end 119 in order to reduce the emission of EMI from the interior of the transceiver module 100.

In the illustrated embodiment, the top housing portion 105 includes a raised structure 104 located at the rear housing end 119 adjacent the rear opening 118. As best seen in FIG. 1D, the raised structure 104 includes two posts 125 oriented toward the bottom housing portion 115. The posts 125 are positioned to be received within the holes defining the conductive vias 120 when the top and bottom housing portions 105, 115 are joined together. Thus, the posts 125 serve to align the PCB 110 with respect to the top housing 105. With the posts 125 aligned with and partially received into the conductive vias 120, two plates 122 formed on the raised structure 104 of the top housing portion 105 are brought into contact with conductive portions on the outer periphery of the conductive vias 120. The plates 122 are formed of an electrically conductive material that enables them to electrically connect with the conductive vias 120 and to contribute in establishing chassis ground when the top and bottom housings 105, 115 are joined together, as will be seen. This arrangement is best seen in FIG. 2E, which shows the plates 122 in electrical contact with the conductive plating of vias 120, thereby establishing electrical contact between vias 120 and top housing 105.

As best seen in FIGS. 1B and 2E (in cross section), the bottom housing 115 includes two plates 130 that are positioned on a ridge 132 of the bottom housing as to be aligned with the conductive vias. In this alignment, the plates 130 are positioned such that they physically contact the exterior periphery of the conductive vias 120 when the top and bottom housing portions 105 and 115 are joined. The plates 130 are also composed of a conductive material and are electrically connected to the bottom housing 115. This enables the plates 130 to participate in conducting chassis ground between the top and bottom housing portions 105 and 115 when the housing portions are joined, as shown in FIG. 2A. The plates 122 of the top housing portion 105 and the plates 130 of the bottom housing portion 115 are positioned such they only electrically connect with the vias 120 and are electrically isolated from all other circuitry on the PCB 110.

In greater detail, because the plates 122 of the top housing 105 are electrically connected to the conductive vias 120 defined in the PCB 110, and the vias are electrically connected to the plates 130, the top housing 105 is in indirectly and electrically connected to the bottom housing 115 by way of a conductive pathway that extends through the conductive vias and each set of plates when the housing portions are clamped into contact with one another. Thus, a chassis ground present at one or both of the housing portions 105, 115 is extended through the conductive pathway, as just described. The extension of chassis ground through this conductive pathway creates what is referred to herein as a "chassis ground fence." As explained below, this chassis ground fence reduces the escape of EMI from the transceiver module, thereby improving the performance of the transceiver.

FIG. 2E illustrates a close-up cross sectional view of a portion of the chassis ground fence. Accordingly, this figure shows one post 125, one plate 122, one complete conductive via 120, and one plate 130 as arranged when the top and bottom housing portions 105 and 115 are joined to form the transceiver module housing. The physical connection between these components is evident in the figure, thereby giving rise to the electrical connection between the top housing portion 105 and the bottom housing portion 115.

As can be seen from FIGS. 2A-2E, the rear opening 118 of the rear housing end 119 is divided and reduced in dimension as a result of the presence of the chassis ground fence defined by the posts 125, plates 122, conductive vias 120, and plates 130. Specifically, these structures introduce portions of the chassis ground through formerly open area defined by the rear opening 118 (see, in comparison, dimension "X" in FIG. 6B) to define two reduced dimension openings 136 and 138. Because of the chassis ground fence and the corresponding reduction in the overall dimension of the rear opening 118, EMI is unable to effectively penetrate the rear housing end 119 through the reduced dimension openings 136. This in turn reduces EMI emission from the transceiver module 100 and prevents interference with operation of either the transceiver or other nearby components. The reduced dimension openings 136 and 138 remain sufficiently sized to allow the connecting traces 140B to pass through without affecting the quality of the signals they carry.

It will be appreciated that the specific configuration of the chassis ground fence defined by the above components can be varied while still providing the desired EMI protection. For instance, the number of plate-via-post-plate combinations can be varied to increase or decrease both the number and size of the reduced-dimension openings at the rear housing end 119. Additionally, the presence, particular shape, and configuration of the raised structure 104 of the top housing 105, as well the ridge 132 supporting the plates 103 of the bottom housing 115 can also be modified as desired to achieve optimum function. In one embodiment, for instance, the height of the raised structure 104 can be altered in order to vary the clearance provided between the top housing 105 and the surface of the PCB 110 on which the connecting traces 140B are located. These and other changes to the chassis ground fence are complicated.

As seen in FIG. 2E, though they align with and may be in electrical contact with the conductive vias 120, the posts 125 in the illustrated embodiment do not completely extend through the vias to directly contact any portion of bottom housing 115. Indeed, direct contact between the posts 125 and the bottom housing 115 is not necessary to extend chassis ground between the top and bottom housing portions 105 and 115. Rather, chassis ground in the illustrated embodiment extends along multiple paths comprising one each of the plates 122, conductive vias 120 and plates 130. If desired, however, each post 125 can be configured in one embodiment to electrically connect with the respective conductive via 120 into which it is received, thereby contributing to the provision of chassis ground between the top and bottom housings 105, 115.

In view of the above discussion, it is seen that the combination of the plates 122, the conductive vias 120, the posts 125, and the plates 130 serve as one means for electrically connecting the top and bottom housing portions 105 and 115 while reducing the area of EMI emission at an end of the transceiver module 100 proximate the edge connector 112. However, it is appreciated that other means can be also employed to achieve this same functionality. For example, alternative structures, such as conductive foams and springs, could be utilized in establishing an electrical chassis ground connection between the top housing 105 and the bottom housing 115. These alternative embodiments, in addition to other embodiments to be explicitly described below, are therefore contemplated within the claims of the present invention.

Reference is next made to FIGS. 3A-3D and FIGS. 4A-4E, which illustrate a transceiver module, designated generally at 200, configured in accordance with another embodiment of the present invention. The transceiver module 200 includes many of the same components as the embodiment described in detail with reference to FIGS. 1A-1D and FIGS. 2A-2E, and to the extent that common features are shared between them, some of these features will not be discussed. As shown in the figures, the module 200 includes a top housing portion 205, a bottom housing portion 215, and a PCB 210. As described above, the top and bottom housing portions 205, 215 fit together to form an outer housing 203 that at least partially encloses the PCB 210. In addition, this outer housing 203 carries an electrical chassis ground around the PCB 210 in the same manner as described above. Extending from a rear housing end 219 of the module 200 is an edge connector 212 portion of the PCB 210. The edge connector 212 includes a plurality of conductive edge traces 240A in communication with connecting traces 240B for transferring electrical data signals between the module 200 and a host device (not shown) that interfaces with the edge connector.

In the illustrated embodiment, the PCB 210 further includes two holes 220 formed through the PCB. Unlike the embodiment described above, the holes 220 are not lined with any conductive material but are simply formed through the dielectric material comprising the PCB 210. The holes 220 are located substantially adjacent the edge connector 212 portion of the PCB 210.

Figure 3B:
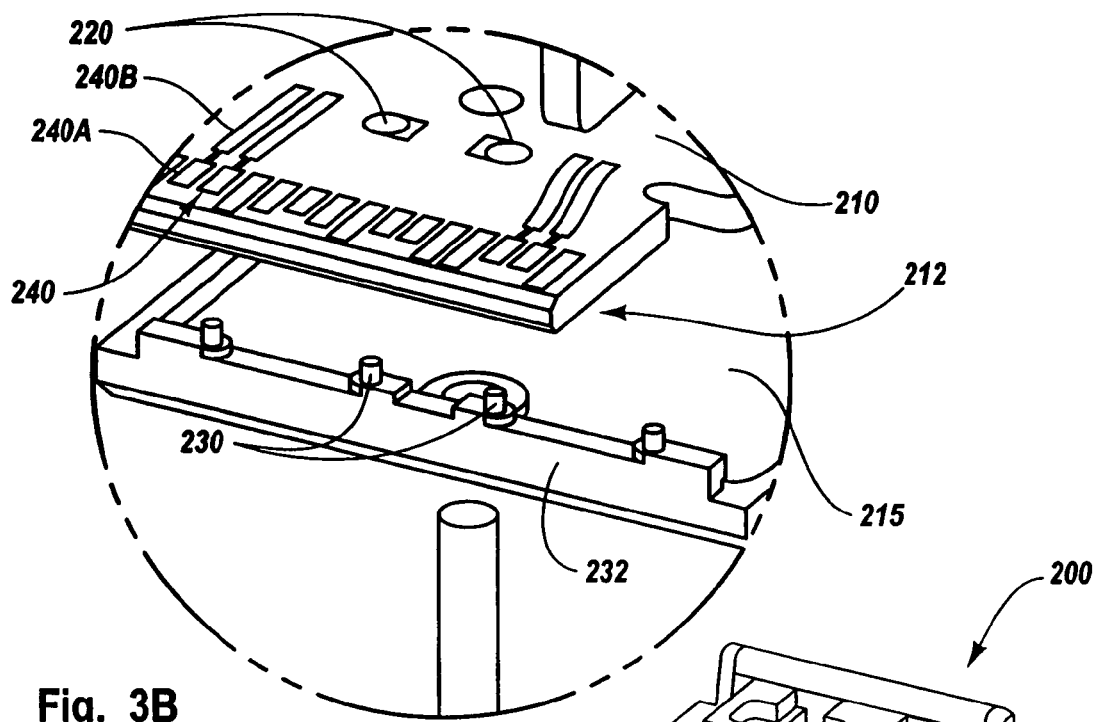
FIG. 3B is an exploded view showing additional details of the rear end of the transceiver module of FIG. 3A.
Figure 3A:
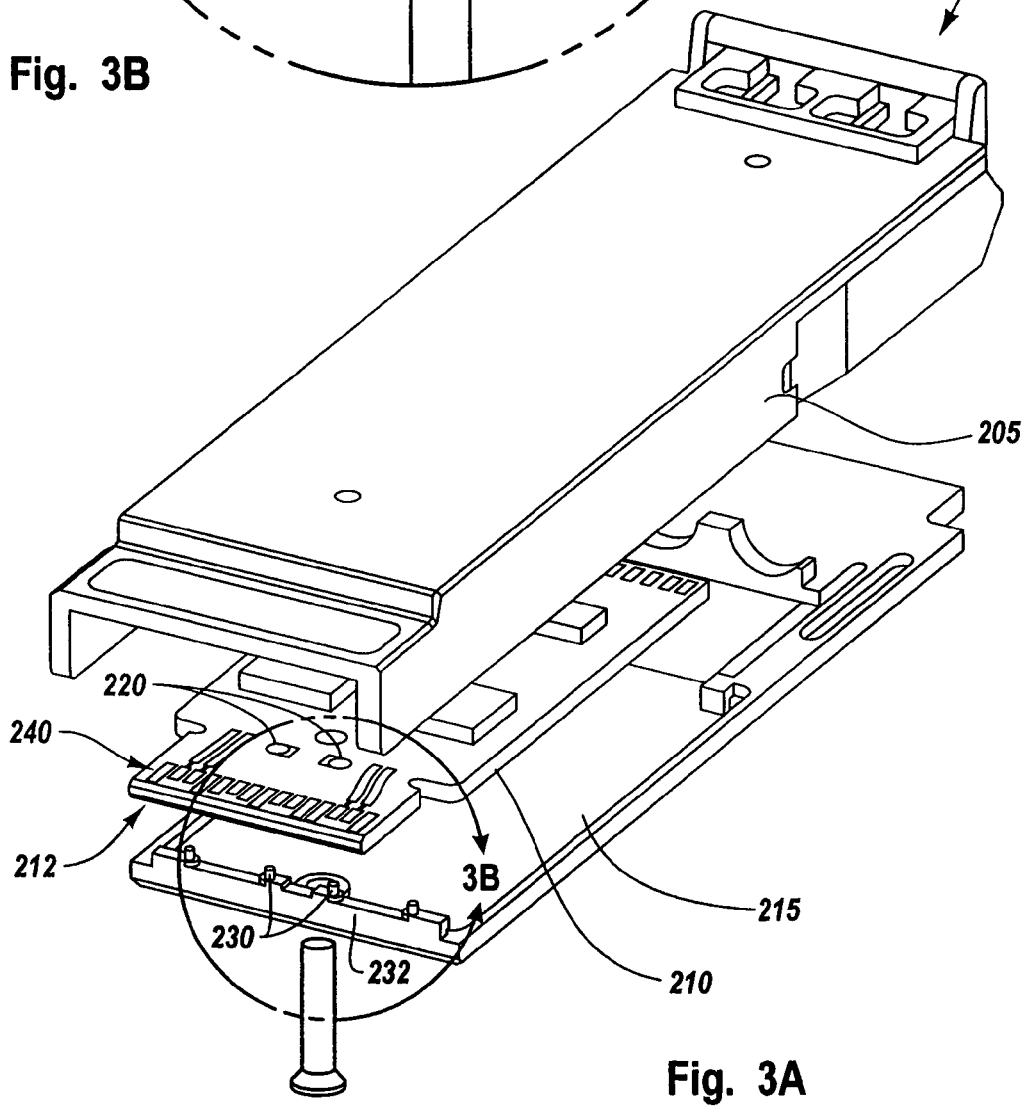
FIG. 3A illustrates an exploded view of another embodiment of a transceiver module.
Figure 3D:
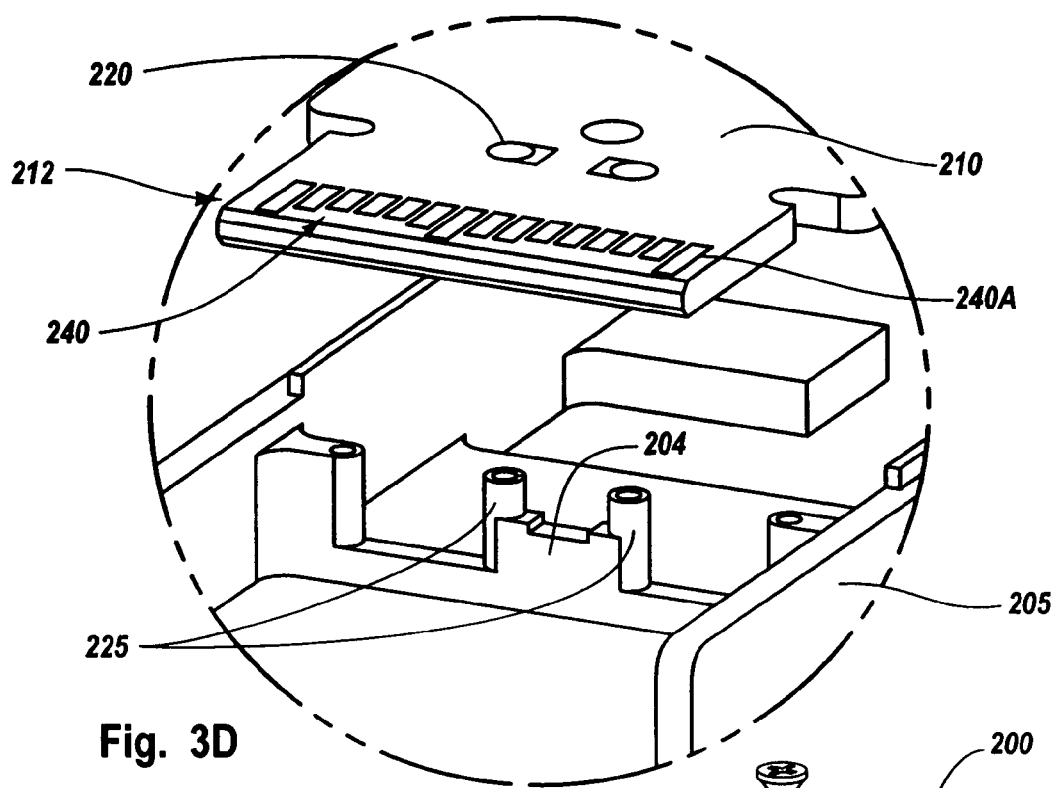
FIG. 3D is an exploded view of the rear end of the transceiver module of FIG. 3A.
Figure 3C:
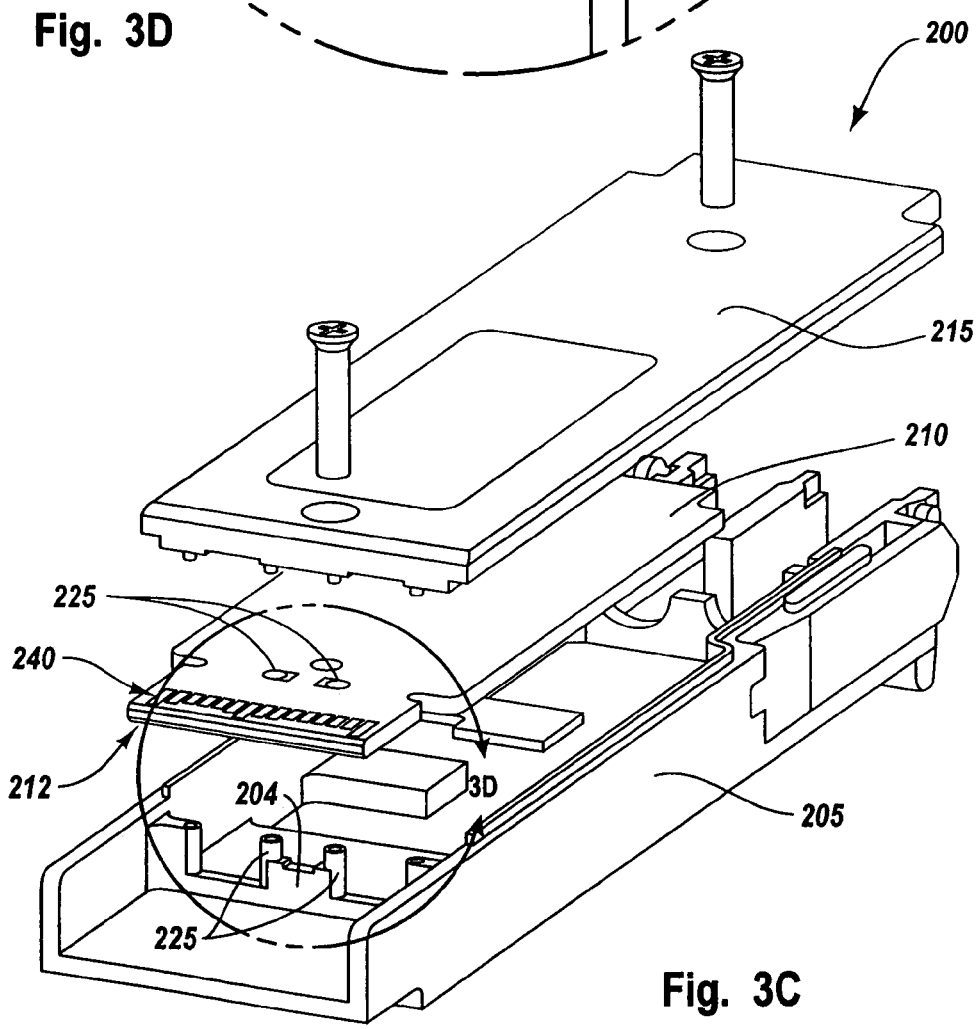
FIG. 3C is an exploded perspective view of the bottom of the transceiver module of FIG. 3A.

The top housing portion 205 includes two bosses 225, best seen in FIGS. 3C and 3D, that are positioned on a raised structure 204 of the top housing 205 so as to be received within the corresponding holes 220 when the top and bottom housing portions 205 and 215 are joined together. Specifically, FIGS. 3D and 4E illustrate how the sockets 225 are received within the holes 220. Each socket 225 is composed of an electrically conductive material and is electrically connected to the top housing 205. In this way, the sockets 225 are connected to chassis ground when the top housing portion 205 is chassis grounded.

The bottom housing portion 215 includes two pins 230 positioned on a ridge 232 that are to be partially received within the holes 220 defined in the PCB 210. In particular, the pins 230 are configured as to be received within corresponding sockets formed in the ends of the bosses 225 when the top and bottom housing portions 205, 215 are joined together. This is best shown in FIG. 4E. Like the bosses 225, the pins 230 are also composed of an electrically conductive material and are electrically connected to the bottom housing portion 215 so that the pins are connected to chassis ground when the bottom housing portion 215 is chassis grounded.

The alignment described above enables the holes 220, bosses 225, and pins 230 to form electrically conductive paths between the top and bottom housings 205 and 215 when the housing portions are joined together. In particular, when the housing portions 205 and 215 are joined, each pin 230 partially passes through the corresponding hole 220 and is received into the socket formed in the corresponding boss 225 (the boss also being partially received by the hole) such that the pin and boss are electrically connected. Because it is not plated with a conductive material, the hole 220 does not contribute to the electrical connection between the pin 230 and the boss 225 in contrast to the previous embodiment, but rather merely provides space for them to connect. As such, the PCB 210 and any circuitry located thereon are electrically isolated from any of the bosses 225 or pins 230.

As was the case with the previous embodiment, when the top and bottom housing portions 205, 215 are joined together, the electrically conductive paths established therebetween via the boss-hole-pin configuration form multiple chassis ground paths between the housing portions when one or both housing portions are chassis grounded. As before, the chassis ground passes through the PCB 210 between the top and bottom housings 205 and 215 via the boss-hole-pin configuration to form a chassis ground fence. Again, as with the previous embodiment, the chassis ground fence reduces the overall size of the opening (i.e., rear opening 218) at the rear housing end 219 by sub-dividing it into smaller-dimensioned openings, designated at 236 and 238. The openings 236 and 238 are sufficiently sized as to enable the connecting traces 240B to pass therethrough without impairing the signals they carry. FIG. 4E illustrates the maximum dimension of one of the openings, opening 238, as comprising a distance 235. As can be seen in comparison with the opening 20 of the prior art transceiver shown in FIG. 6B, the dimension 235 of the opening 238 is substantially smaller than dimension X of the opening 20. As before, this relatively reduced dimension of the openings 236 and 238 at the rear housing end 219 results in reduced EMI emissions escaping from the rear housing end of the transceiver module 200. Again, absent the two sets of holes 220, sockets 225, and pins 230, the opening distance would span an area much greater than that defined by the two reduced dimension openings 236, 238, thereby undesirably increasing the area of escape for EMI. As before, it should be remembered that the particular hole-boss-pin configuration shown in the present embodiment is merely exemplary of the structure that can be utilized in providing a chassis ground fence for containing EMI in a transceiver module. Other configurations that preserve this function are also contemplated. Additionally, it is appreciated that the chassis ground fence concept can be extended to areas of the transceiver module other than the rear housing end, if desired.

Reference is now made to FIGS. 5A-5B, which illustrate yet another embodiment of the present invention. Again, to the extent that common features are shared between this and previous embodiments, some of these features will not be discussed. FIGS. 5A and 5B include views of a portion of an optical transceiver module 300 having top and bottom housing portions 305 and 315, respectively. The top and bottom housing portions 305 and 315 together form the transceiver housing, which contains a PCB 310. Similar to the previous embodiment, the PCB 310 includes two holes 320 defined therethrough near an end thereof, the end being located substantially adjacent a rear housing end 319 of the transceiver module 300. The holes 320 are not lined with a conductive material and are aligned to each receive a post 325 extending from and electrically connected to a portion of the top housing portion 305. Each post 325 extends through the respective hole 320 and contacts a portion of the bottom housing portion 315, in this case, one of two plates 330, which are electrically connected with the bottom housing portion.

The engagement of each post 325 with the respective plate 330 creates a conductive path that electrically connects the top housing portion 305 to the bottom housing portion 315. Further, this connection enables chassis ground to be extended through the conductive path, thereby forming a chassis ground fence at the rear housing end 319 of the transceiver module 300, as in previous embodiments. In contrast to previous embodiments, however, each post 325 completely extends through the respective hole 320 of the PCB 310 to contact the respective plate 330 of the bottom housing portion 315. In other embodiments, the post 325 can extend through the hole 325 and directly contact a flat surface of the bottom housing portion 315, thereby obviating the need for the plate 330. Or, in yet another embodiment, the post-hole-plate configuration can be modified by plating each hole 320 with a conductive plating similar to that found in the embodiment illustrated in FIGS. 1A-2E, further enhancing the electrical contact between the housing portions. The present embodiment, in addition to the previous and following embodiments, therefore serves as another example of a means for electrically connecting the top and bottom housing portions with chassis ground as to reduce the area of emission of electromagnetic interference from an end of the transceiver module.

Reference is next made to FIGS. 6A-6B, which illustrate a printed circuit board, designated generally at 500, configured in accordance with yet another embodiment of the present invention. The printed circuit board 500 in this embodiment is designed to fit within the housing of a transceiver module. However, the EMI reduction modifications are implemented on the printed circuit board 500 alone. Therefore, the printed circuit board 500 described in this embodiment can be utilized with existing unmodified housings of the same form factor to form a complete transceiver module. The printed circuit board 500 includes high speed edge traces 520 positioned on the edge connector portion 512 of the printed circuit board 500. The high speed edge traces 520 are electrically connected to embedded traces 525 that tunnel through the dielectric material within the printed circuit board and are then electrically connected to median traces 530. The median traces 530 are positioned on the surface of the printed circuit board 500 like the high speed edge traces 520 as illustrated in FIG. 6A. The printed circuit board 500 further includes two electrical vias 535. The electrical vias 535 are narrow holes that extend through the entire printed circuit board 500 that are filled with an electrically conductive material. The vias 535 are electrically isolated from all other circuitry on or within the printed circuit board 500. These vias 535 provide a connection point to the module housing such that a chassis ground can extend through the printed circuit board. Only one side of the vias 535 need be electrically connected to the housing in order to encircle the embedded traces 525 with the chassis ground because of an embedded ground layer 540, described below.

The cut-away view illustrated in FIG. 6B shows how the printed circuit board further includes an embedded ground layer 540 that encircles the embedded traces 525. The embedded ground layer 540 is electrically connected to the vias 535 in order to carry the chassis ground from the housing. The embedded ground layer 540 is a conductive material that is embedded within the printed circuit board in the manner shown in FIG. 6B. By incorporating this embedded ground layer 540 that carries the chassis ground, particular EMI waves generated within the housing are effectively prevented from leaking out. The printed circuit board 500 in this embodiment is designed to fit within a housing that completely eliminates a rear opening by actually touching the printed circuit board 500 at a lateral location between the high speed edge traces 520 and the vias 535. Since all electrical data within this region is transferred through the embedded traces 525, it is possible for the housing to physically contact the printed circuit board (completely eliminating the open space that commonly allows EMI waves to leak out) without electrically interfering with the transference of data. As described above, the vias 535 can be equipped with conductive devices known in the art to ensure that an electrical connection between the vias 535 and the housing (not shown) is established, such as a conductive foam or spring. In addition, the embedded ground of this embodiment can be combined with the interconnection schemes of the previous embodiments to provide a different electrical connection between the printed circuit board 500 and the housing (not shown).

In one embodiment, in order to further facilitate reliable electrical connection between the top housing and the vias 535 and between the bottom housing and the vias 535, a conductive band 550 can be formed around the surface of the PCB 500, as illustrated in FIGS. 6A and 6B. The thickness of the conductive band 550 is exaggerated in FIG. 6B for purposes of visibility in the illustration. The conductive band 550 both establishes a conductive ground path around the PCB and also enhances the electrical connection with the top and bottom housings. This conductive band or strip 550 is particularly useful in establishing a reliable electrical connection with springs or foam EMI gaskets that can be used with the top and bottom housing.

In summary, the present invention relates to a module design that reduces the leakage of particular EMI waves by passing a ground through or piercing a PCB that is within a grounded housing. The piercing ground does not affect any of the circuitry on the PCB but has the effect of minimizing the size of any openings through which EMI can escape. The teachings of the present invention are applicable to any electrical module that potentially generates high frequency data that causes potentially harmful EMI waves.

The present invention may be embodied in other specific forms without departing from its spirit or essential characteristics. The described embodiments are to be considered in all respects only as illustrative and not restrictive. The scope of the invention is, therefore, indicated by the claims rather than by the foregoing description. All changes which come within the meaning and range of equivalency of the claims are to be embraced within their scope.

What is claimed is:

1. A printed circuit board ("PCB"), comprising:
   a piece of dielectric material including circuitry and an edge connector portion;
   an edge trace located on a surface of the edge connector portion;
   an embedded trace substantially disposed within the dielectric material, the embedded trace electrically connecting the edge trace with a corresponding median trace located on a surface of the dielectric material, the median trace being in communication with at least some of the circuitry;
   an embedded ground structure disposed within the dielectric material and at least partially encircling the embedded trace; and
   a conductive element passing substantially through the dielectric material and being electrically connected to the embedded ground structure, wherein the embedded ground structure and the conductive element are electrically isolated from the circuitry.

2. The PCB as recited in claim 1, wherein the circuitry is configured for use in connection with the operation of one or more optoelectronic components.

3. The PCB as recited in claim 1, wherein the embedded ground structure is positioned for electrical communication with a module housing when the PCB is disposed therein.

4. The PCB as recited in claim 1, wherein the conductive element passes substantially vertically through the dielectric material.

5. The PCB as recited in claim 1, wherein the conductive element is positioned between the edge trace and the median trace.

6. The PCB as recited in claim 1, wherein the embedded ground structure comprises a pair of ground planes disposed above and below, respectively, the embedded trace.

7. The PCB as recited in claim 1, wherein the conductive element comprises a conductive via.

8. The PCB as recited in claim 1, wherein the conductive element is configured to connect with a chassis ground.

9. The PCB as recited in claim 1, wherein the conductive element is positioned for electrical communication with a module housing when the PCB is disposed therein.

10. The PCB as recited in claim 1, further comprising a conductive band extending around at least a portion of the dielectric material and being in electrical communication with the conductive element.

11. The PCB as recited in claim 10, wherein the conductive band is positioned so as to at least partially encircle the embedded trace.

12. A printed circuit board ("PCB") for use in an electronic module that includes a housing, the PCB being substantially disposed within the housing and comprising:
   a piece of dielectric material including circuitry and an edge connector portion;
   an edge trace located on a surface of the edge connector portion;
   an embedded trace substantially disposed within the dielectric material, the embedded trace electrically connecting the edge trace with a corresponding median trace located on a surface of the dielectric material, the median trace being in communication with at least some of the circuitry;
   an embedded ground structure disposed within the dielectric material and at least partially encircling the embedded trace; and
   a conductive element passing substantially through the dielectric material and being electrically connected to the embedded ground structure and to the housing of the electronic module, the conductive element and embedded ground structure being electrically isolated from the circuitry and the embedded trace.

13. The PCB as recited in claim 12, wherein the circuitry comprises circuitry for use in connection with one or more optoelectronic components.

14. The PCB as recited in claim 12, wherein the embedded ground structure is in electrical communication with the module housing.

15. The PCB as recited in claim 12, wherein the conductive element passes substantially vertically through the dielectric material.

16. The PCB as recited in claim 12, wherein the conductive element is positioned between the edge trace and the median trace.

17. The PCB as recited in claim 12, wherein the embedded ground structure comprises a pair of ground planes disposed above and below, respectively, the embedded trace.

18. The PCB as recited in claim 12, wherein the conductive element comprises a conductive via.

19. The PCB as recited in claim 12, wherein the conductive element is configured to connect with a chassis ground.

20. The PCB as recited in claim 12, wherein the conductive element is in electrical communication with the module housing.

21. The PCB as recited in claim 12, further comprising a conductive band extending around at least a portion of the PCB and being in electrical communication with the conductive element.

22. The PCB as recited in claim 21, wherein the conductive band is positioned so as to at least partially encircle the embedded trace.

23. A printed circuit board ("PCB") for use in an optical transceiver module that includes an optical transmitter and an optical receiver substantially disposed within a housing, the PCB being substantially disposed within the housing of the optical transceiver module and comprising:

a piece of dielectric material including circuitry and an edge connector portion, at least some of the circuitry being in communication with at least one of: the optical transmitter; and, the optical receiver;

a plurality of edge traces located on a surface of the edge connector portion and configured to electrically interface with a host system;

a plurality of embedded traces substantially disposed within the dielectric material, each embedded trace electrically connecting an edge trace with a corresponding median trace located on a surface of the dielectric material, the median traces being in communication with the circuitry;

an embedded ground structure disposed within the dielectric material and substantially encircling the plurality of embedded traces, the embedded ground structure being electrically isolated from the plurality of embedded traces and the circuitry; and at least two conductive vias passing through the dielectric material and being electrically connected to the embedded ground structure and to the housing of the optical transceiver module.

24. The PCB as recited in claim 23, wherein the at least two conductive vias are positioned between the plurality of edge traces and the median trace.

25. The PCB as recited in claim 23, further comprising a conductive band extending about at least a portion of the PCB and being in electrical communication with the at least two conductive vias.

26. The PCB as recited in claim 25, wherein the conductive band is positioned so as to substantially encircle the plurality of embedded traces.

* * * * *

UNITED STATES PATENT AND TRADEMARK OFFICE
CERTIFICATE OF CORRECTION

PATENT NO.         : 7,286,372 B2                                    Page 1 of 1
APPLICATION NO. : 10/831600
DATED              : October 23, 2007
INVENTOR(S)        : Aronson et al.

It is certified that error appears in the above-identified patent and that said Letters Patent is hereby corrected as shown below:

Column 2
Line 13, change "define" to --defines--
Line 23, change ""EMI"," to --"EMI,"--
Line 47, change "FIG. 6B" to --FIG. 7C--
Line 51, change "FIG. 6B" to --FIG. 7C--
Line 54, change "if" to --of--

Column 3
Line 7, after "modules" insert --,--

Column 7
Line 2, after "such" insert --that--
Line 8, omit "in"
Line 12, change "one" to --each--

Column 8
Line 6, omit "one"
Line 20, change "be also" to --also be--

Column 9
Line 46, change "FIG. 6B" to --FIG. 7C--
Line 65, change "FIGS. 5A-5B" to --FIGS. 5A-5C--

Column 10
Line 2, change "FIGS. 5A and 5B" to --FIGS. 5A-5C--

Signed and Sealed this

Ninth Day of November, 2010

David J. Kappos
*Director of the United States Patent and Trademark Office*